US006816614B1

(12) United States Patent
Desplats et al.

(10) Patent No.: US 6,816,614 B1
(45) Date of Patent: Nov. 9, 2004

(54) METHOD FOR COMPARING RECORDED PIXEL IMAGES REPRESENTING EQUIPOTENTIAL LINES OF AT LEAST AN INTEGRATED CIRCUIT CHIP

(75) Inventors: Romain Desplats, Toulouse (FR); Philippe Perdu, Toulouse (FR)

(73) Assignee: Centre National D'Etudes Spatiales, Paris (FR)

( * ) Notice: Subject to any disclaimer, the term of this patent is extended or adjusted under 35 U.S.C. 154(b) by 0 days.

(21) Appl. No.: 09/831,519

(22) PCT Filed: May 21, 1999

(86) PCT No.: PCT/FR99/01211

§ 371 (c)(1),
(2), (4) Date: May 10, 2001

(87) PCT Pub. No.: WO00/30038

PCT Pub. Date: May 25, 2000

(30) Foreign Application Priority Data

Nov. 13, 1998 (FR) .............................. 98 14276

(51) Int. Cl.$^7$ ................................ G06K 9/00
(52) U.S. Cl. ............... 382/170; 382/145; 382/270; 382/262; 382/257; 382/218
(58) Field of Search .................... 382/218, 145, 382/149, 270, 170, 262, 257

(56) References Cited

U.S. PATENT DOCUMENTS 5,127,064 A * 6/1992 Flinois et al. ............... 382/149

FOREIGN PATENT DOCUMENTS

| EP | 0 619 551 | 10/1994 |
|----|-----------|---------|
| EP | 0 853 243 | 7/1998  |

OTHER PUBLICATIONS

Geraud–Liria et al. "Failure Analysis by Dynamic Voltage Contrast Development of a Semi–Automatic System," ISTFA 1987, Los Angeles, pp. 67–73.

Perdu. "Etude de circuits integres par contraste de potentiel : analyse des phenomenes de charge induits dans la couche de passivation," These de doctorat de l'Universite Paul Sabatier, No. 1740, pp. 37–50, 1994.

Desplats et al. "High Speed Failure Localization With a New Application of $I_{DDQ}$ Testing" May 25, 1998.

Desplats et al. "Shorter Failure Analysis Using a New Application of $I_{DDQ}$ for Defect Localization in ICs," Sep. 1998.

* cited by examiner

Primary Examiner—Bhavesh M. Mehta
Assistant Examiner—Ali Bayat
(74) Attorney, Agent, or Firm—Young & Thompson (57) ABSTRACT

The invention concerns a method for comparing two recorded pixelated source images (2a, 2b) of the same rectangular format representing in contrasted form the equipotential lines on an integrated circuit chip. The method consists in subjecting each source image (2a, 2b) to an adaptive thresholding processing with three contrast levels, then forming a result image (14) from the processed source images (3a, 3b) by assigning to each pixel a contrast level defined according to a logical rule of comparison.

21 Claims, 4 Drawing Sheets

AND+

METHOD FOR COMPARING RECORDED PIXEL IMAGES REPRESENTING EQUIPOTENTIAL LINES OF AT LEAST AN INTEGRATED CIRCUIT CHIP

CROSS-REFERENCE TO RELATED APPLICATIONS

This is a §371 National Stage, of PCT/FR99/01211, with priority to FR 98/14276 filed Nov. 13, 1998.

BACKGROUND OF THE INVENTION

The invention concerns a method for comparing two recorded pixel images of the same rectangular format, called source images, representing in monochrome contrasted form, with E+1 possible contrast levels (E being a positive integer, for example equal to 255), equipotential lines of at least an integrated circuit chip.

DESCRIPTION OF THE RELATED ART

It is known that it is possible to analyze defects of integrated circuits by comparing images which represent in monochrome contrasted form the potentials of the tracks of a chip, while the input ports of the integrated circuit are subjected to predetermined input signal vectors (cf., for example, "Failure Analysis by dynamic voltage contrast development of a semi-automatic system", N. GERAUD-LIVIA, G. PEREZ, A. CUQUEL, P. PERDU, ISTFA 1987, Los Angeles, pp. 67–73; thesis by M. P. PERDU, "Etude de circuits intégrés par contraste de potentiel: analyse des phénomènes de charge induits dans la couche de passivation", Université Paul Sabatier, No. 1740, 1994, pp. 1–50).

In the methods described hitherto, comparison of the source images presupposes data processing of the images (automatic analysis of brightness and contrast; simple mean through integration; smoothing of the digitized image; differential suppression of topographical information, interactive thresholding in three levels of gray by the operator on the color screen (trinarization), erosion, etc.).

The images are then superimposed and coordinated, either manually or by means of a computer, to disclose the location of the defect.

Nevertheless, in view of the highly complex nature of images of modern integrated circuits such as CMOS or BICMOS circuits, such semi-automatic methods, which still require a large amount of human intervention, are not sufficiently sophisticated, particularly in respect of their speed of execution and the accuracy of representation of the equipotentials.

Moreover, it is necessary to produce images for numerous electrical states (typically, from several hundreds to several tens of thousands) and, for each electrical state, a very large number of images to cover the entire surface of the same chip (several hundreds, or even several thousands). Human comparison of each pair of images, between a defective circuit and a reference circuit, is extremely time-consuming and tedious, even when alignment of the images is computer-assisted, and is therefore not sufficiently efficient to be applied on an industrial scale.

It should be noted, in this connection, that the integrated circuit manufacturing industry now requires that defective circuits be capable of being analyzed in a very rapid and systematic manner.

SUMMARY OF THE INVENTION

The object of the invention, therefore, is to overcome the above-mentioned disadvantages of the previous methods.

It is thus an object of the invention to propose a method for comparing images which can be automated to a large extent and be performed very rapidly and repeatedly on a multitude of images.

It is also an object of the invention to eliminate visual analysis of superimposed images by a human operator for the purpose of comparing them.

It is also an object of the invention to optimize the speed of processing of the images during this comparison.

It is also an object of the invention to propose a method which renders possible, in a simple and rapid manner, different image comparisons, particularly for searching for common equipotentials and/or equipotentials of the same form and location and of different potential states, and/or combination of equipotentials excluding common equipotentials, etc.

The invention, to achieve these objects, concerns a method for comparing two recorded pixel images of the same rectangular format, called source images, representing in monochrome contrasted form, with E+1 possible contrast levels, equipotential lines of at least an integrated circuit chip, characterized in that:

each source image is subjected to an adaptive thresholding processing with three distinct contrast levels, white, black and gray, called normal contrast levels, preferably corresponding respectively to the numerical values E, 0, and to an at least approximately median value between 0 and E—in particular, INT (E/2), INT being the integral number function—so as to assign to each pixel of the image one of these three normal contrast levels, an image, called the result image, is then formed from the thus processed source images by assigning to each pixel of the result image a normal contrast level selected from the three normal contrast levels of white, black and gray and determined in accordance with a predetermined logical rule of comparison, according to the nature of the comparison to be made, and in accordance with the normal contrast levels assigned to the corresponding pixels of the same location of the source images on completion of the adaptive thresholding processing.

Throughout the text, the normal contrast levels are for reasons of simplicity designated as white, gray and black, but it is understood that these qualifiers do not necessarily strictly designate the corresponding pure colors but, on the contrary, also include the case in which the contrast levels would be colored with the same dark color replacing the black and/or the same light color replacing the white. The invention is thus equally applicable in this case. Most generally, monochrome images such as those obtained by electronic microscope are, in practice, contrasted in black and white. Furthermore, in practice, it is sufficient to define a dark normal contrast level by a low value (which may or may not be equal to 0), a light contrast level by a high value (which may or may not be equal to E), and an intermediate contrast level by a median value.

The source images are formed of pixels, i.e., in the recording format generally referred to as "bitmap". Such images can originate directly from a digital image processing system, or result from a digital conversion from a source image of a different recording format.

Advantageously, according to the invention, the adaptive thresholding processing of a source image comprising b columns of pixels and c rows of pixels is effected by:

defining, from the source image, a plurality of rectangles $R_{i,j}$ formed of rectangular blocks of d rows of pixels and e columns of pixels, extracted from the source image, d<c and e<b, the rectangles $R_{i,j}$ being defined to represent the source image in rows i of rectangles and columns j of rectangles, calculating, for each rectangle $R_{i,j}$, the value of the minimum contrast level NGmin, the value of the maximum contrast level NGmax, the value of the mean contrast level NGmoy and the value of the standard deviation of the contrast levels ETNG of the different pixels of the rectangle $R_{i,j}$, calculating the number of normal contrast levels having to be assigned to each rectangle $R_{i,j}$, determining the value of each normal contrast level of each rectangle $R_{i,j}$, establishing, for each rectangle $R_{i,j}$, a law for converting the actual contrast level of each pixel of the source image into a normal contrast level assigned to that pixel. A normal contrast level is then assigned to each pixel of each rectangle in accordance with this law, and the source image is reconstructed.

Each rectangle $R_{i,j}$ is formed of a block of contiguous pixels, i.e., is formed of a rectangular portion of the source image.

The standard deviation ETNG is the square root of the variance. It is also possible to use the variance itself, which enables an operation to be eliminated, or any other particular standard deviation formula which represents the value of the deviations relative to the mean contrast level.

Advantageously, according to the invention, the rectangles $R_{i,j}$ are defined so that:

each pair of rectangles $R_{i,j}$; $R_{i,j+1}$ which adjoin on the same row of rectangles overlap over half of their width, i.e., have a number of columns in common, of the order of e/2, each pair of rectangles $R_{i,j}$; $R_{i+1,j}$ which adjoin on the same column of rectangles overlap over half of their width, i.e., have a number of rows in common, of the order of d/2.

In particular, this overlapping of the rectangles makes it possible to avoid analysis errors due to the digital processing in very particular cases or, if such an error does occur, to correct its effects. Moreover, since each pixel is calculated several times (as belonging to several different rectangles (up to four if the boundaries are excluded or up to nine if they are included)), the numerical convergence of the method is assured in almost all cases.

Advantageously, according to the invention, d and e are selected so that if the minimum size of each object represented by the source image is a rectangle of g pixels in length and f pixels in width, f≦g, then:

$$10 \leq e \leq 10 f \text{ and } 10 \leq d \leq 10 g.$$

Advantageously, according to the invention, d and e are selected to be between 20 and 60, in particular, of the order of 40 for f and g between 5 and 15, in particular, of the order of 10. Advantageously, according to the invention, d and e are selected so that d/e=c/b. Thus, the shape of the rectangles $R_{i,j}$ corresponds to that of the source image. For example, if the source image is square, the rectangles $R_{i,j}$ are square.

Advantageously, according to the invention, the number of normal contrast levels NNG in each rectangle $R_{i,j}$ is calculated by:

calculating the number of main peaks NP of the histogram curve of the actual contrast levels of the rectangle $R_{i,j}$, each peak corresponding to a maximum of the histogram curve, defining the following conditions:

first condition: the histogram curve has at least three peaks,
second condition: NGmoy≧S1 and (NGmax−NGmin)/NGmoy≧S2,
third condition: NGmax−NGmin≧S3 and ETNG≧S4,
fourth condition: the histogram curve has at least two peaks,
fifth condition: NGmax−NGmin≧S5 and ETNG≧S6, wherein S1, S2, S3, S4, S5 and S6 are threshold values predetermined according to the type of integrated circuit represented by the source images and the characteristics of the image processing installation used for producing these source images, sixth condition: the first condition and at least one of the second condition or the third condition are fulfilled,
seventh condition: the fourth condition and the fifth condition are fulfilled, examining whether the sixth condition is fulfilled and, if such is the case, defining and recording the number of normal contrast levels NNG equal to three; if such is not the case, examining whether the seventh condition is fulfilled and, if such is the case, defining and recording the number of normal contrast levels NNG equal to two; if such is not the case, with neither the sixth nor the seventh condition being fulfilled, defining and recording the number of normal contrast levels NNG equal to one.

The threshold values S1, S2, S3, S4, S5, S6 can be defined experimentally according to the nature of the integrated circuits and corresponding source images.

Advantageously, according to the invention, for CMOS type integrated circuits with layout gauges of between $0.7\mu$ and $1.5\mu$, S1 is selected to be of the order of 100; S2 of the order of 1.3; S3 of the order of 160; S4 of the order of 47; S5 of the order of 130; S6 of the order of 60.

Once the number of normal contrast levels has been determined, it is necessary to determine the value of each of them and to assign one of them to each pixel.

Advantageously, according to the invention, when the number of normal contrast levels NNG of at least one rectangle $R_{i,j}$ of the source image is equal to three, a normal contrast level NCN is assigned to each pixel whose actual contrast level is NCR by:

separating the peaks of the histogram curve of the rectangle $R_{i,j}$ by vertical boundaries passing through the minimum points between the peaks, calculating by integration the area of each peak of the histogram curve of the rectangle $R_{i,j}$, selecting the three large peaks which have larger values, selecting from these three large peaks one peak, called the central peak, which is located between the two others and is delimited by a lower boundary FI and an upper boundary FS on the scale of contrast levels, assigning the normal contrast level NCN equal to gray for any pixel whose actual contrast level NCR is included between the lower boundary FI and the upper boundary FS, assigning the normal contrast level NCN equal to black for any pixel whose actual contrast level NCR is below the lower boundary FI, assigning the normal contrast level NCN equal to white for any pixel whose actual contrast level NCR is above the upper boundary FS.

Moreover, for each rectangle Ri',j' whose number of normal contrast levels NNG is less than or equal to 2, the value of this (these) normal contrast level(s) NNG is determined from a rectangle Ri,j comprising three previously assigned normal contrast levels, by assigning step-by-step the normal contrast levels of the pixels common to the rectangle(s) which overlap between the rectangles Ri,j and Ri',j'.

Advantageously, according to the invention, when no rectangle Ri,j has a number of normal contrast levels NNG equal to three, the rectangles Ri,j are processed one after the other, step-by-step, in successive stages, by comparing in each stage a zone, called the source zone, formed of at least one rectangle Ri,j having previously undergone such a stage, and a rectangle Ri,j having an overlap zone in common with the source zone.

Advantageously, according to the invention, when the number of normal contrast levels of all the rectangles Ri,j is equal to 1, the normal contrast level gray is assigned to all the pixels of the image.

Also advantageously, according to the invention, when the normal contrast levels have been assigned to all the pixels of a rectangle Ri,j, this rectangle Ri,j is subjected to a reduction processing, comprising a median filtering in the course of which each pixel is assigned the median value of the normal contrast levels of the set of pixels comprising this pixel and the pixels surrounding it.

Advantageously, according to the invention, the source image is reconstructed by reassembling the rectangles Ri,j, one after the other, in successive reassembly stages, from a gray image of the same format as the source image, and by executing, pixel by pixel, an extended OR logical rule OR+ between the image of the preceding stage and the rectangle Ri,j to be reassembled, by assigning to each pixel of the source image to be reconstructed the normal contrast level:

white if the pixels of the image of the preceding reassembly stage and of the rectangle Ri,j are, respectively, white and gray, or white and white;

black if the pixels of the image of the preceding reassembly stage and of the rectangle Ri,j are, respectively black and gray, or black and black;

gray in the other cases.

This reconstruction by successive extended OR logical rules OR+ allows resolution of any value discordances resulting from the median filtering processing on the rectangles.

The logical rules of comparison which can then be used in a method according to the invention are varied. Advantageously, according to the invention, a logical rule of comparison is used which is selected from the following logical rules of comparison:

extended AND function AND+: each pixel of the result image is assigned the normal contrast level:
black if the two corresponding pixels of the source images are black,
white if the two corresponding pixels of the source images are white,
gray in the other cases, extended exclusive-OR function XOR+: each pixel of the result image is assigned the normal contrast level:
gray if the two corresponding pixels of the source images have the same normal contrast level,
white if the two corresponding pixels of the source images are white and gray, or white and black, or gray and black,
black if the two corresponding pixels of the source images are black and gray, or black and white, or gray and white. It is to be noted that the order of the source images is of importance for the extended exclusive −OR rule of comparison XOR+.

If it is wished to compare the differences between the images (equipotentials of the same form and location and of different potentials), a logical rule of comparison similar to the preceding rules can be used. Nevertheless, it is also possible to differentiate between complex pixelated images (with the actual contrast levels) by simple numerical means.

Thus, advantageously, according to the invention, at least one of the source images results from a differentiation stage performed previously between two images, called initial images, representing a surface portion of an integrated circuit chip, and in the course of which the actual contrast level NCR of each pixel of the source image is calculated from the actual contrast levels NCRA and NCRB of the corresponding pixels of the same location of the initial images, according to the formula: NCR=(NCRA−NCRB)/2+INT(E/2). INT represents the integral number function.

Moreover, prior to using a source image in an image comparison stage, an integration of this source image is performed on several identical photographs corresponding to this source image, and a median filtering is performed by assigning to each pixel the median value of the set of pixels formed by this pixel and the pixels surrounding it, so as to suppress the peaks due to noise.

Advantageously, according to the invention, integration and median filtering are performed on the initial images which are then differentiated to obtain a source image.

Also advantageously, according to the invention, the result image is subjected to a reduction processing comprising a median filtering consisting in assigning to each pixel the median value of the normal contrast levels of the set of pixels comprising this pixel and the pixels surrounding it, followed by an erosion and expansion processing for the normal contrast levels white and black.

The invention also concerns a method characterized by all or some of the characteristics mentioned above or below in combination.

The invention provides an extremely rapid and powerful method of comparison which in practice proves to be efficient for comparing images of integrated circuits, particularly such as those derived from systems of image processing by electronic microscopy applying potential contrast by secondary electron detection. It thus enables the methods of analyzing the defects of integrated circuits (tracing and physical characterization) to be accelerated and rendered reliable.

Other aims, characteristics and advantages of the invention are disclosed by the following description which refers to the appended figures, given by way of non-restrictive example, wherein.

DESCRIPTION OF THE PREFERRED EMBODIMENT

Figure 1:
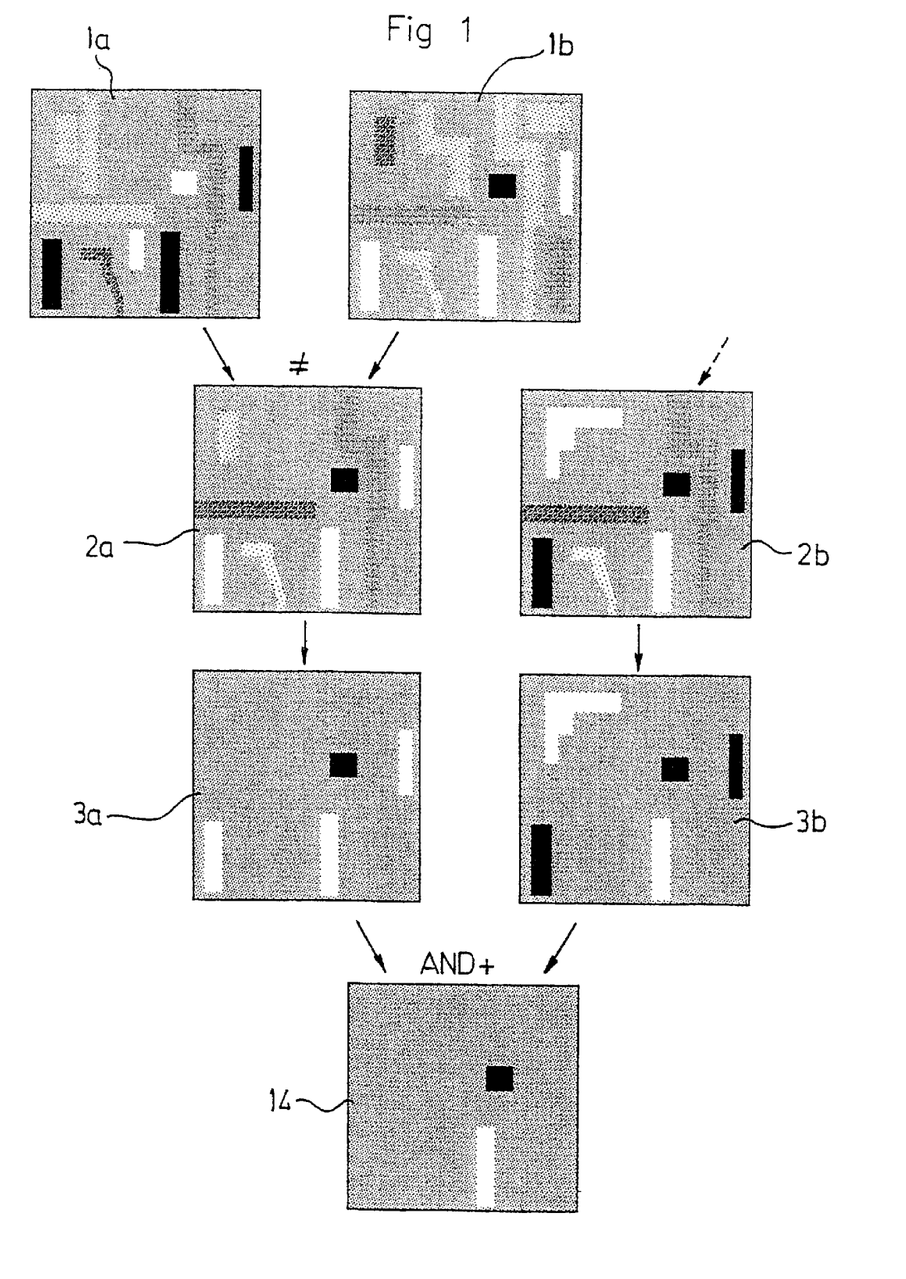
FIG. 1 is a diagram showing a simplified example of images processed and compared according to the invention.

For the purpose of illustrating the invention, FIG. 1 shows, in extremely simplified form, pixel images of the same square format, representing in monochrome contrasted form the equipotential lines of at least an integrated circuit chip. In practice, such images are actually much more complex and represent a much larger number of details. Moreover, only a small number of actual contrast levels (levels of gray) is shown, whereas in practice this number can be very large, and is typically 256=E+1.

The two images 1a, 1b are initial images representing a surface portion of an integrated circuit chip, obtained by an appropriate system of image processing, which can be a system of image processing by electronic microscopy applying potential contrast by secondary electron detection, for example an IDS 5000 HX system, as marketed by the company SCHLUMBERGER TECHNOLOGIES (FRANCE). Any other image processing system can also be used, provided that the images obtained represent in monochrome contrasted form equipotential lines of an integrated circuit chip. The images provided by these image processing systems are pixelated digitized images having a scale of contrast levels, generally comprising, for example, 256 levels of gray, numbered 0 to 255=E.

On each of the initial images 1a, 1b, an integration is first performed on several identical photographs corresponding to this initial image. This integration consists in successively producing n identical images of the integrated circuit chip and in assigning to each pixel the mean value of the pixel of the n identical images. For example, n=16 is selected.

Figure 5A:
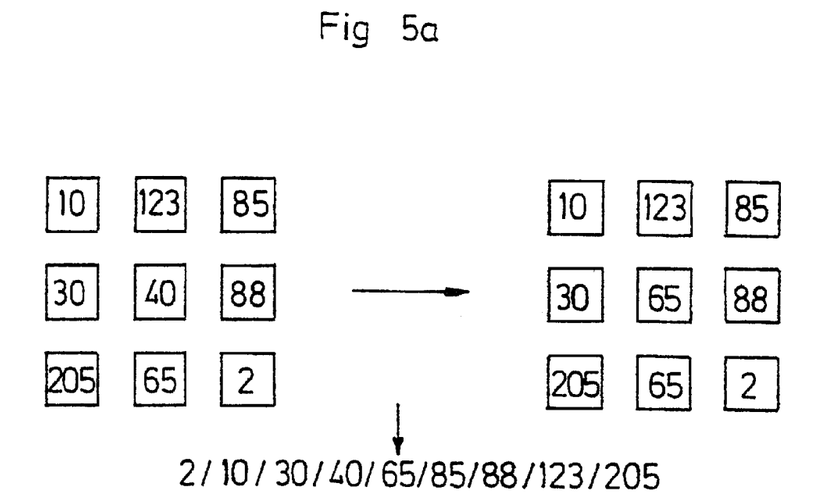
FIGS. 5a and 5b are diagrams illustrating a reduction processing stage of a process according to the invention, in the case (FIG. 5a) of an image with 256 actual contrast levels and in the case (FIG. 5b) of an image with three normal contrast levels, FIG. 5b, obtained following adaptive thresholding.

A median filtering is first performed by assigning to each pixel the median value of the set of pixels formed by this pixel and the pixels surrounding it, so as to suppress the peaks due to noise. This median filtering is performed as shown in FIG. 5a. Under consideration is the block of pixels formed by one pixel and the eight pixels surrounding it. In the example shown, the central pixel has the value 40. This set of pixels is classified by incremental value and, to modify the value of the central pixel, the median value obtained by this classification is selected, i.e., the fifth value which, in the example shown, is 65. The value of the central pixel is then replaced by this median value 65, as shown on the right-hand part of FIG. 5a. For the edge pixels, the column or row containing the pixel is duplicated to form a set of 9 pixels, on which the median value is determined.

The integration processing of the initial images 1a, 1b permits reduction of the ergodic and stationary noise. The median filtering permits suppression of the noise peaks, without affecting the dynamic range and the contrast of the images. These operations are performed numerically, pixel by pixel.

From the two initial images 1a, 1b, a numerical differentiation is performed, enabling a source image 2a to be obtained. This differentiation is performed by calculating the actual contrast level NCR of each pixel of the source image 2a from the actual contrast levels NCRA and NCRB of the corresponding pixels of the same location of the initial images 1a, 1b, according to the formula: NCR=(NCRA−NCRB)/2+INT(E/2), where INT represents the integral number function.

This differential formula is based on the hypothesis according to which the actual contrast levels of the equipotentials of an integrated circuit chip are either located in the white or located in the black, according to the logical state of the equipotential line (the signal which passes through it being low-voltage or high-voltage), the background of the image being represented by gray. Consequently, for those pixels having actual contrast levels which are similar or close (i.e., adjacent potentials), the image resulting from the differentiation has a pixel located in the grays. Conversely, if the actual contrast levels of a pixel between the two initial images 1a, 1b are very different, the pixel of the result image will appear in the whites or the blacks.

A source image 2a, having E+1 (for example 256) possible contrast levels, is thus obtained. Similarly, it is possible to obtain a second image 2b having E+1 possible contrast levels. This second source image 2b may or may not be the result of a differential numerical processing of two other initial images.

The method according to the invention permits comparison of the two source images 2a, 2b. This is achieved by first subjecting each of these source images 2a, 2b to an adaptive thresholding processing with three levels of contrast, white, black and gray, called normal contrast levels, corresponding respectively to the numerical values E,0 and a median value between 0 and E—in particular, INT(E/2) or INT (E/2)+1—so as to assign to each pixel of the thus processed image one of these three normal contrast levels. An image 3a, 3b is thus obtained which then has only three normal contrast levels. With E=255, the black pixels have the value 0, the white pixels have the value 255 and the gray pixels have the value 127. Other values can be selected, provided that three balanced, distinct normal contrast levels are defined, one low (dark), one high (light) and one intermediate.

It is to be noted that the previously performed differential numerical processing stage not only makes it possible to indicate the separate electrical states between the two initial images 1a, 1b, but also divides the noise by two, reduces the topographical effect and reduces the quantity of information to be subsequently processed, particularly during the adaptive thresholding stage.

The adaptive thresholding stage is performed as described below.

Figure 2:
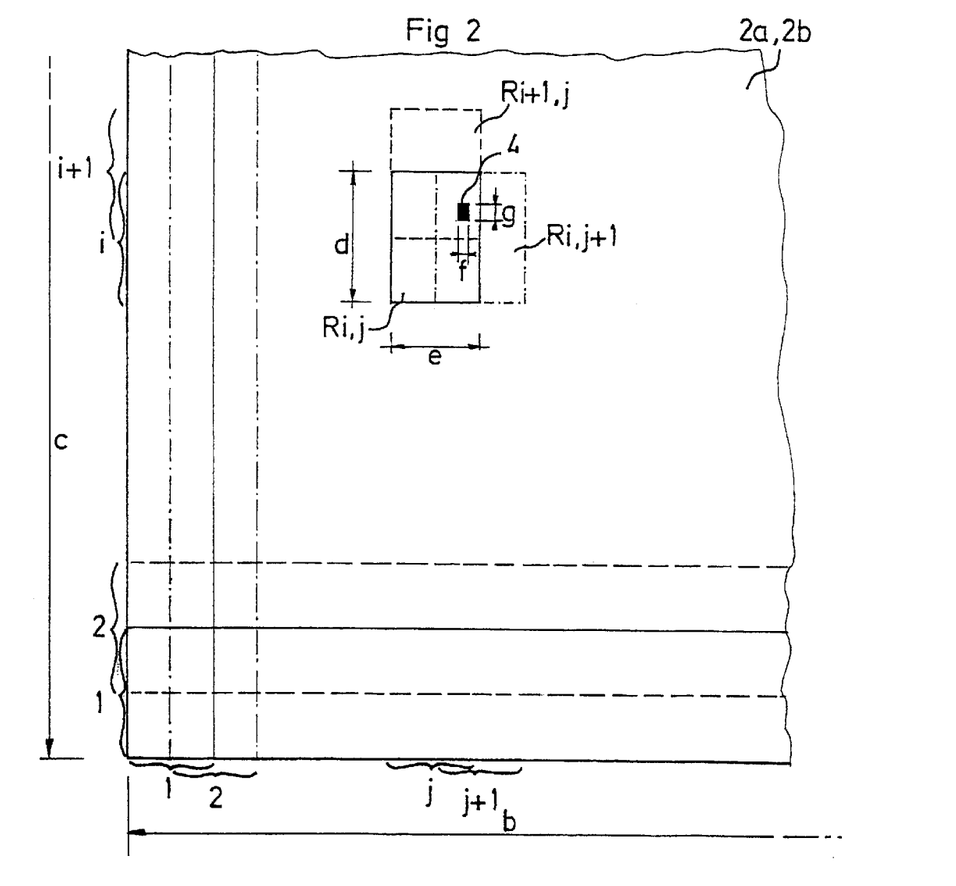
FIG. 2 is a partial schematic view of a source image illustrating the definition of the rectangles Ri,j.

The source image 2a, 2b comprises b pixel columns and c pixel rows. As shown in FIG. 2, a plurality of rectangles Ri,j is defined from the source image 2a, 2b. Each rectangle Ri,j is formed of a rectangular block having d pixel rows and e pixel columns, and is extracted from the source image 2a, 2b. The rectangles Ri,j are defined to represent the source image 2a, 2b in rows of rectangles numbered i and in columns of rectangles numbered j. The rectangles are smaller than the total format of the source image, i.e., d<c and e<b. As shown by FIG. 2, The rectangles Ri,j are defined so that for each i and j:

two rectangles Ri,j; Ri,j+1 which adjoin on the same row i of rectangles overlap over half of their width, i.e., have a number of columns in common, of the order of e/2, two rectangles Ri,j; Ri+1,j which adjoin on the same column j of rectangles overlap over half of their width, i.e., have a number of rows in common, of the order of d/2.

Thus, each pixel generally belongs to several separate rectangles Ri,j; Ri+1,j; Ri,j+1, and Ri+1,j+1 (up to four if the boundaries are not included or up to nine if they are included).

The dimension d and e of a rectangle is selected in relation to the minimum size of each object represented by the source image 2a, 2b. This minimum object size is represented by a rectangle of g pixels in length and f pixels in width, $f \leq g$. d and e are selected so that:

$$10 \leq e \leq 10f, \ 10 \leq d \leq 10g.$$

Advantageously, d and e are selected to be between 20 and 60, in particular, of the order of 40 for f and g between 5 and 15, in particular, of the order of 10. FIG. 2 shows a black object 4 of desired minimum size. The minimum size of the objects of the images is, in fact, easily known due to the fact that these images represent integrated circuits whose track widths are known.

Furthermore, d and e are selected so that d/e=c/b, i.e., so that the form of the rectangles corresponds to that of the source image 2a, 2b. Any amplification phenomenon in a direction of the adaptive thresholding processing is thus prevented.

In each rectangle Ri,j:

for each rectangle Ri,j, the values of the minimum contrast level NGmin, the maximum contrast level NGmax, the mean contrast level NGmoy and the standard deviation of the contrast levels ETNG of the different pixels of the rectangle Ri,j are calculated, the number of normal contrast levels having to be assigned to each rectangle Ri,j is calculated the value of each normal contrast level of each rectangle Ri,j is determined, for each rectangle Ri,j, a law is established for converting the actual contrast levels of each pixel of the source image into a normal contrast level assigned to that pixel, as described below, and their normal contrast level is then assigned to each pixel in accordance with this law.

Figure 3:
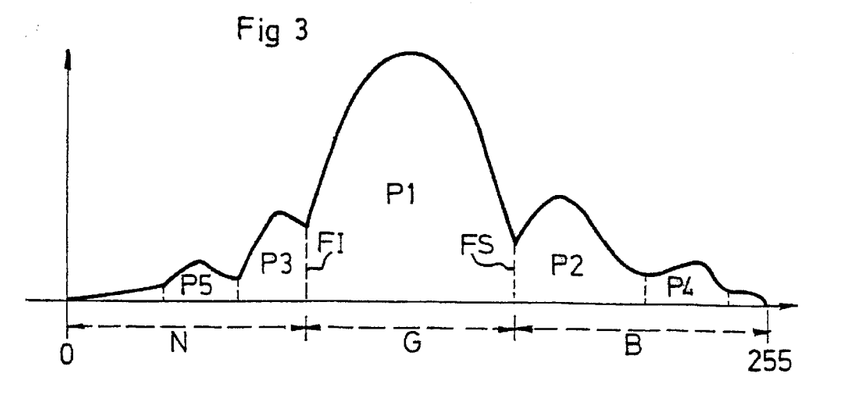
FIG. 3 is an example of a histogram of a rectangle Ri,j according to the invention.

In each rectangle Ri,j, the value of each pixel is known and it is possible to plot the histogram curve of the actual contrast levels (FIG. 3). The abscissa of such a histogram represents the actual contrast levels from 0 to E=255 and the ordinate represents the number of pixels of the rectangle for each actual contrast level.

The number of main peaks NP of this histogram curve, each corresponding to a maximum, is calculated numerically, as follows:

numerical smoothing is performed by replacing the value of each pixel by the mean value calculated on five adjoining pixels, a polynomial extrapolation of the smooth histogram curve is performed and the function derived from the polynomial is calculated and recorded, the roots of this derivative are calculated, recorded and sequenced in ascending order, the roots are recorded alternately and successively as maximum values and minimum values, the first root being a maximum value.

The number of normal contrast levels NNG in each rectangle Ri,j is calculated by defining the following conditions:

first condition: the histogram curve has at least three peaks (NP≧3), second condition: NGmoy≧S1 and (NGmax−NGmin)/NGmoy≧S2, third condition: NGmax−NGmin≧S3 and ETNG≧S4, fourth condition: the histogram curve has at least two peaks (NP≧2), fifth condition: NGmax−NGmin≧S5 and ETNG≧S6, wherein S1, S2, S3, S4, S5 and S6 are threshold values predetermined according to the type of integrated circuit represented by the source images and the characteristics of the image processing installation used for producing these source images, sixth condition: the first condition and at least one of the second condition or the third condition are fulfilled, seventh condition: the fourth condition and the fifth condition are fulfilled, examining whether the sixth condition is fulfilled and, if such is the case, defining and recording the number of normal contrast levels NNG equal to three; if such is not the case, examining whether the seventh condition is fulfilled and, if such is the case, defining and recording the number of normal contrast levels NNG equal to two; if such is not the case, with neither the sixth nor the seventh condition being fulfilled, defining and recording the number of normal contrast levels NNG equal to one.

The threshold values S1, S2, S3, S4, S5, S6 can be defined experimentally from known images by examining the different conditions in the different zones of the images in which it is known, by visual examination, that these zones should contain three, or two, normal contrast levels or one single normal contrast level. It is sufficient to compile a table representing the above-mentioned different statistical values for the different displayed image zones. It is then possible to define boundaries separating the normal contrast levels on the image. In practice, this experimental operation is rapid and can be performed from one or two images. It remains applicable to each integrated circuit of the same technology and for each image processing system.

For example, with the IDS 5000 HX image processing system and for CMOS type integrated circuits, with layout gauges of between $0.7\mu$ and $1.5\mu$, S1 is selected to be of the order of 100; S2 of the order of 1.3; S3 of the order of 160; S4 of the order of 47; S5 of the order of 130; S6 of the order of 60.

Figure 4:
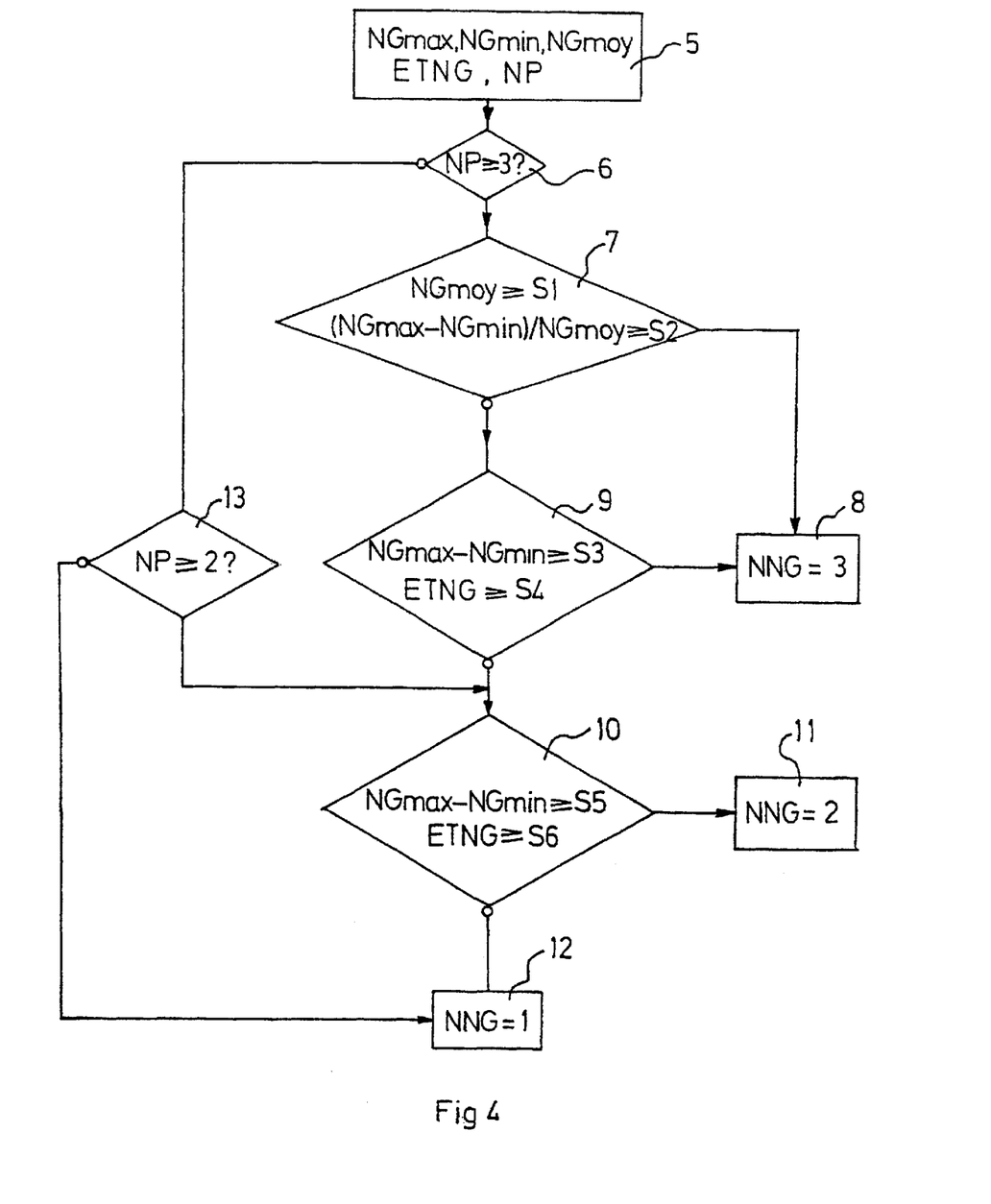
FIG. 4 is a flow chart of a stage of a process according to the invention which permits determination of the number of normal contrast levels NNG of a rectangle Ri,j.

FIG. 4 shows the flow chart of the above-mentioned stage permitting determination of the value of the number of normal gray levels NNG of the rectangle Ri,j. Stage 5 represents the calculation of the statistical variables NGmax, NGmin, NGmoy, ETNG and NP. In stage 6 it is examined whether NP≧3. If such is the case, it is examined in Stage 7 whether the second condition is fulfilled. If this condition is fulfilled NNG=3 (stage 8). Otherwise, it is examined whether the third condition is fulfilled in stage 9. If such is the case, NNG=3 is defined. Otherwise, the fifth condition is examined in stage 10. If such is the case, NNG=2 is defined in stage 11. Otherwise, NNG=1 is defined in stage 12. If NP is not equal to 3 in stage 6, it is examined whether it is greater than or equal to 2 in stage 13. If such is the case, the process is resumed at stage 10 (examination of the fifth condition). Otherwise, NNG=1 is defined in stage 12.

It is to be noted that, in a variant which is not depicted, it is possible to use only one of the stages 7 or 9, i.e., only one of the second condition or the third condition.

It is then necessary to attribute a normal contrast level to each pixel of the image. In so doing, several situations can occur.

When the number of normal contrast levels NNG of at least one rectangle Ri,j of the source image is equal to three, a normal contrast level NCN is assigned to each pixel having an actual contrast level NCR by:

separating the peaks of the histogram curve of the rectangle Ri,j by vertical boundaries passing through the minimum points between the peaks, calculating by integration and recording the area of each peak of the histogram curve of the rectangle Ri,j, selecting the three large peaks which have larger values, selecting from these three large peaks one peak, called the central peak, which is located between the two others and is delimited by a lower boundary FI and an upper boundary FS on the scale of contrast levels, assigning and recording the normal contrast level NCN equal to gray for any pixel whose actual contrast level NCR is included between the lower boundary FI and the upper boundary FS, assigning and recording the normal contrast level NCN equal to black for any pixel whose actual contrast level NCR is below the lower boundary FI, assigning and recording the normal contrast level NCN equal to white for any pixel whose actual contrast level NCR is above the upper boundary FS.

Then, for each rectangle Ri',j' whose number of normal contrast levels NNG is less than or equal to 2, the value of this (these) normal contrast level(s) NNG is determined from a rectangle Ri,j comprising three previously assigned normal contrast levels, by assigning step-by-step the normal contrast levels of the pixels common to the rectangle(s) overlapping between the rectangles Ri,j and Ri',j'.

Consequently, it can be seen that if at least one of the rectangles Ri,j has a number of normal contrast levels NNG=3, the whole of the source image 2a, 2b can be processed by adaptive thresholding, the value of each pixel being capable of being assigned to a normal contrast level.

When no rectangle Ri,j has a number of normal contrast levels NNG equal to three, but at least one rectangle Ri,j has a number of normal contrast levels equal to two, namely, a lower normal contrast level and an upper normal contrast level, the gray normal contrast level is assigned to one of the normal contrast levels of at least one rectangle, called the first rectangle, having two normal contrast levels, and the normal contrast levels of the other rectangles are assigned step-by-step from the first rectangle.

This is because it is known that the contrast level most frequently represented in an image is the gray (FIG. 3), corresponding to the background of the image, the equipotential lines generally appearing as white or as black. Consequently, it is normally possible to find on the image at least one first rectangle having two normal contrast levels, and for which one of them can be assigned to gray. This assignment can be performed by manual examination and manual capture, i.e., through intervention of the human operator. Once the gray normal contrast level of the first rectangle has been assigned, all the pixels of the images can be calculated numerically. The second normal contrast level of the first rectangle is thus assigned by examining whether the corresponding peak on the histogram is above or below the previously assigned gray normal contrast level. The contrast levels of the other rectangles are then assigned step-by-step from the first rectangle.

When no rectangle Ri,j has a number of normal contrast levels NNG equal to three, numerical calculation can be used to automate the determination of the value (white, black or gray) of the normal contrast level(s) of each rectangle Ri,j by numerical means, as follows.

The rectangles Ri,j are processed one after the other, step-by-step, in successive stages. In each stage, a zone, called the source zone, formed of at least one rectangle Ri,j having previously undergone such a stage, is compared with a rectangle Ri,j having an overlap zone in common with the source zone.

If the source zone has one and only one normal contrast level NGa and the rectangle has one and only one normal contrast level NGb, then NGa=NGb. The rectangle and the source zone are combined to form the subsequent source zone, which will also have one and only one normal contrast level, and the process passes to the next rectangle.

If the source zone has one and only one normal contrast level NGa and the rectangle has two normal contrast levels NGc and NGd, NGc>NGd (NGc is white or gray and NGd is black or gray), it is known that NGa=NGc or NGa=NGd. The rectangle and the source zone are combined to form the subsequent source zone, of which it is known that it will have two normal contrast levels called NGa and NGb, and the process passes to the next rectangle.

If the source zone has two normal contrast levels NGa>NGb (NGa is white or gray, and NGb is black or gray) and the rectangle has one and only one normal contrast level NGc, it is known that NGa=NGc or NGb=NGc. The rectangle is combined with the subsequent source zone, of which it is known that it will have the two normal contrast levels NGa and NGb, and the process passes to the next rectangle.

If the source zone has two normal contrast levels NGa>NGb and the rectangle has two normal contrast levels NGc>NGd, the common overlap zone between the source zone and the rectangle is examined first. This is done by taking a test hypothesis, for example, NGa=NGc=white and NGb=NGd=black. If R' is the portion of the source zone corresponding to this overlap zone and R" is part of the rectangle corresponding to this overlap zone, the normal contrast levels NGa=NGc or NGb=NGd are assigned to the pixels of R' and R" and the logical operation R' XOR+R" is performed, pixel by pixel, followed by a median filtering of the result of this logical operation.

The XOR+ operation is an extended exclusive-OR, as defined below, which makes it possible to know whether certain pixels have a different normal contrast level in R' and R".

If the result is entirely gray, there are no pixels which have a different normal contrast level in R' and R". It is then sufficient to examine the pixels of R', for example by comparing the minimum and maximum values of the pixels to know whether one or other of the following cases actually pertains: NGa=NGc (a high level); or NGb=NGd (a low level); or, if there are two separate levels, NGa=NGc and NGb=NGd, or (NGa,NGb)=(NGc,NGd).

If the result of the XOR+ operation is not entirely gray, it is known that there is only one contrast level in R' and R", NGa or NGb. It is furthermore known whether this normal contrast level is high or low. If it is high, NGa=NGd applies, if it is low, NGb=NGc applies.

Depending on these results of the preliminary examination of the overlap zone, it is possible to proceed as follows.

If (NGa,NGb)=(NGc,NGd), the rectangle and the source zone are combined to form the subsequent source zone, of which it is known that it will have two normal contrast levels NGa and NGb.

If NGb=NGd, it is not possible to know anything about NGa and NGc. The source zone is recorded, the new subsequent source zone is limited to the rectangle which has just been processed, and the process passes to the next rectangle.

If the final rectangle to be processed is thus reached without the normal contrast levels having been assigned (it is not always possible to know whether the entire source image comprises two or three normal contrast levels), the recorded source zone which has the largest area (having the largest number of pixels) is selected and the main peak of the histogram of this zone is assigned to the gray. From this value, it is then possible to determine the other normal contrast level of this zone. This assignment is repeated, as necessary, on all the other recorded source zones.

If NGa=NGc, it is not possible to know anything about NGb and NGd, and the procedure is as indicated for the case of NGb=NGd.

If NGb=NGc, then NGa>NGb=NGc>NGd. There are then three normal contrast levels in the image: NGa=white, NGb=NGc=gray, and NGd=black. The normal contrast levels of each pixel can then be assigned from this source zone and this rectangle.

Likewise, if NGa=NGd, then $NGc$=white>$NGd$=$NGa$=gray>$NGb$=black.

The normal contrast level of each of the pixels can then be assigned from this source zone and this rectangle.

In practice, despite the above processing, it is possible that in very improbable and very rare cases the normal contrast levels cannot be assigned in very particular zones of the image. For these zones, the normal contrast levels are then assigned visually and manually.

Otherwise, the normal contrast level of each pixel is assigned from the histogram of the rectangle, as indicated above (in the case of three normal contrast levels), by separating the main peaks by vertical boundaries and examining where the value of the actual contrast level of the pixel is located in relation to the boundaries.

Moreover, when the number of normal contrast levels of all the rectangles Ri,j is equal to 1, the normal contrast level gray is assigned to all the pixels of the image. This is because it is known that gray corresponds to the background of the image and is the majority contrast level.

Thus, each pixel of the images 3a, 3b can be calculated by adaptive thresholding from the images 2a, 2b.

When the normal contrast levels have been assigned to all the pixels of a rectangle Ri,j, this rectangle Ri,j is subjected to a reduction processing, comprising a median filtering in the course of which each pixel is assigned the median value of the normal contrast levels of the set of pixels comprising this pixel and the pixels surrounding it.

The reduction processing also advantageously comprises an erosion and an expansion of the pixels for the normal contrast levels black and white. This pixel erosion or expansion processing, which is well known in the art, allows suppression of non-significant projecting or trough pixels. With such a processing, an isolated pixel is suppressed, a pixel which projects in relation to a block of the same contrast levels is suppressed, and a pixel which occupies a trough in a block of different contrast levels is replaced at the contrast level of the block. The groups of pixels are thus reformed into polygonal blocks.

Figure 5B:
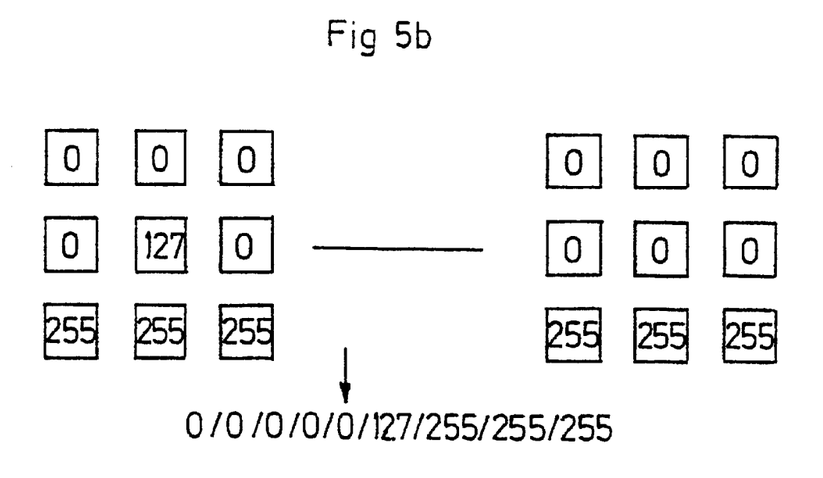

FIG. 5b shows the median filtering processing performed on an image portion which has undergone adaptive thresholding with three contrast levels. As can be seen, in each set of pixels the value of normal contrast levels selected is that which corresponds to the fifth value obtained by sequencing the nine values in ascending order.

The source images 3a, 3b are then reconstructed from an entirely gray image of the same format in which the rectangles Ri,j are reassembled one after the other, in successive reassembly stages.

At each reassembly stage, a rectangle Ri,j is processed to reassemble it in the image, and an extended logical OR operation OR+ is performed pixel by pixel between the image obtained in the preceding reassembly stage (gray image in the case of the first reassembly stage) and the rectangle Ri,j, by assigning to each pixel of the source image 3a, 3b to be reconstructed the following normal contrast level:

white if the pixels of the image of the preceding reassembly stage and of the rectangle Ri,j are, respectively, white and gray, or white and white;

black if the pixels of the image of the preceding reassembly stage and of the rectangle Ri,j are, respectively black and gray, or black and black;

gray in the other cases.

An expansion is thus performed which permits correction of any inconsistencies introduced by the preceding median filtering processing. Thus, if one and the same pixel is assigned to gray in a rectangle and to an extreme normal contrast level (black or white) in another, through the OR+ operation it will be assigned this extreme normal contrast level in the source image 3a, 3b. If this pixel is black in one rectangle and white in another, it is probably a boundary zone between two equipotentials of opposite potential levels, and is then assigned to gray, which will delimit the boundary.

When the adaptive thresholding stage has been performed, the thus processed images 3a, 3b having only three normal contrast levels can be used for performing logical rules of comparison. According to the invention, an image, called the result image 14, is then formed from the source images 3a, 3b which have undergone the adaptive thresholding stage, by assigning to each pixel of the result image 14 a normal contrast level selected from the three normal contrast levels of white, black and gray and determined, in accordance with a predetermined logical rule of comparison according to the nature of the comparison to be made, and in accordance with the normal contrast levels of the corresponding pixels of the same location of the source images 3a, 3b determined on completion of the adaptive thresholding processing.

Advantageously, according to the invention, for example, a logical rule of comparison is used which is selected from the following logical rules of comparison:

extended AND function AND+: each pixel of the result image is assigned the normal contrast level:
- black if the two corresponding pixels of the source images are black,
- white if the two corresponding pixels of the source images are white,
- gray in the other cases, extended exclusive-OR function XOR+: each pixel of the result image is assigned the normal contrast level:
- gray if the two corresponding pixels of the source images have the same normal contrast level,
- white if the two corresponding pixels of the source images are white and gray, or white and black, or gray and black,
- black if the two corresponding pixels of the source images are black and gray, or black and white, or gray and white.

An extended AND function AND+ makes it possible to view on the result image 14 the common electrical states between the two source images 3a, 3b, i.e., the equipotential lines common to the source images 2a, 2b. A comparison using an extended exclusive-OR function XOR+ makes it possible to view the differences in electrical states between the two images 3a, 3b, i.e., the equipotential lines of the source images 2a, 2b which have the same form and same location, but different potentials, in particular, opposite potentials.

Advantageously, according to the invention, the result image 14 is subjected to a reduction processing comprising a median filtering consisting in assigning to each pixel the median value of the normal contrast levels of the set of pixels comprising this pixel and the pixels surrounding it, followed by an erosion and expansion processing for the normal contrast levels white and black.

The invention thus enables integrated circuit images to be analyzed and compared simply and rapidly by numerical means. In particular, it is applicable to the locating of defects on defective logical integrated circuits. It is thus possible to view on the result image 14 a defective logic gate and/or a defective logic gate input equipotential line and/or a defective logic gate output equipotential line.

Moreover, it is to be noted that the two source images 2a, 2b can be representative of one and the same zone of one and the same integrated circuit chip or, on the contrary, be representative of one and the same zone of a chip of two different integrated circuits, for example, a defective integrated circuit, and the non-defective reference circuit corresponding to it. This is because, on completion of the adaptive thresholding stage, the images have been simplified and can be realigned in relation to one another prior to forming the result image 14 and performing the appropriate logical rule of comparison. This realignment can even be performed by data processing, since the general form of the objects of the image is defined unambiguously on completion of the adaptive thresholding stage.

The method according to the invention can be performed by programming the functions described above on any appropriate data processing system, for example, on the IDS 5000 HX imaging processing system itself.

The invention can be the subject of numerous other applications and embodiment variants of those described above and depicted in the figures.

What is claimed is:

1. A method for comparing two recorded pixel images of the same rectangular format, called source images (2a, 2b), representing in monochrome contrasted form, with E+1 possible contrast levels, equipotential lines of at least an integrated circuit chip, wherein:

each source image (2a, 2b) is subjected to an adaptive thresholding processing with three distinct contrast levels, white, black and gray, called normal contrast levels, so as to assign to each pixel of the image one of these three normal contrast levels, an image, called the result image (14), is then formed from the thus processed source images (3a, 3b) by assigning to each pixel of the result image (14) a normal contrast level selected from the three normal contrast levels of white, black and gray and determined in accordance with a predetermined logical rule of comparison, according to the nature of the comparison to be made, and in accordance with the normal contrast levels assigned to the corresponding pixels of the same location of the source images (3a, 3b) on completion of the adaptive thresholding processing.

2. A method as claimed in claim 1, wherein, the adaptive thresholding processing of a source image comprising b columns of pixels and c rows of pixels is effected by:

defining, from the source image (2a, 2b), a plurality of rectangles Ri,j formed of rectangular blocks of d rows of pixels and e columns of pixels, extracted from the source image, d<c and e<b, the rectangles Ri,j being defined to represent the source image (2a, 2b) in rows i of rectangles and columns j of rectangles, calculating, for each rectangle Ri,j, the value of the minimum contrast level NGmin, the value of the maximum contrast level NGmax, the value of the mean contrast level NGmoy and the value of the standard deviation of the contrast levels ETNG of the different pixels of the rectangle Ri,j, calculating the number of normal contrast levels having to be assigned to each rectangle Ri,j, determining the value of each normal contrast level of each rectangle Ri,j, establishing, for each rectangle Ri,j, a law for converting the actual contrast level of each pixel of the source image into a normal contrast level assigned to that pixel.

3. A method as claimed in claim 2, wherein the rectangles Ri,j are defined so that:

each pair of rectangles Ri,j; Ri,j+1 which adjoin on the same row of rectangles overlap over half of their width, i.e., have a number of columns in common, of the order of e/2, each pair of rectangles Ri,j; Ri+1,j which adjoin on the same column of rectangles overlap over half of their width, i.e., have a number of rows in common, of the order of d/2.

4. A method as claimed in claim 2, wherein d and e are selected so that if the minimum size of each object represented by the source image is a rectangle of g pixels in length and f pixels in width, f£g, then:

$$10£e£10\,f \text{ and } 10£d£10\,g.$$

5. A method as claimed in claim 4, wherein d and e are selected to be between 20 and 60, in particular, of the order of 40 for f and g between 5 and 15, in particular, of the order of 10.

6. A method as claimed in claim 2, wherein d and e are selected so that d/e=c/b.

7. A method as claimed in claim 2, wherein the number of normal contrast levels NNG in each rectangle Ri,j is calculated by:
   calculating the number of main peaks NP of the histogram curve of the actual contrast levels of the rectangle Ri,j, each peak corresponding to a maximum of the histogram curve,
   defining the following conditions:
      first condition: the histogram curve has at least three peaks,
      second condition: NGmoy$^3$S1 and (NGmax−NGmin)/NGmoy$^3$S2,
      third condition: NGmax−NGmin$^3$S3 and ETNG$^3$S4,
      fourth condition: the histogram curve has at least two peaks,
      fifth condition: NGmax−NGmin$^3$S5 and ETNG$^3$S6,
   wherein S1, S2, S3, S4, S5 and S6 are threshold values predetermined according to the type of integrated circuit represented by the source images and the characteristics of the image processing installation used for producing these source images,
   sixth condition: the first condition and at least one of the second condition or the third condition are fulfilled.

8. A method as claimed in claim 7, wherein for CMOS type integrated circuits with layout gauges of between 0.7μ and 1.5μ, S1 is selected to be of the order of 100; S2 of the order of 1.3; S3 of the order of 160; S4 of the order of 47; S5 of the order of 130; S6 of the order of 60.

9. A method as claimed in claim 7, wherein when the number of normal contrast levels NNG of at least one rectangle Ri,j of the source image is equal to three, a normal contrast level NCN is assigned to each pixel whose actual contrast level is NCR by:
   separating the peaks of the histogram curve of the rectangle Ri,j by vertical boundaries passing through the minimum points between the peaks,
   calculating by integration the area of each peak of the histogram curve of the rectangle Ri,j, selecting the three large peaks which have larger values, selecting from these three large peaks one peak, called the central peak, which is located between the two others and is delimited by a lower boundary FI and an upper boundary FS on the scale of contrast levels,
   assigning the normal contrast level NCN equal to gray for any pixel whose actual contrast level NCR is included between the lower boundary FI and the upper boundary FS,
   assigning the normal contrast level NCN equal to black for any pixel whose actual contrast level NCR is below the lower boundary FI,
   assigning the normal contrast level NCN equal to white for any pixel whose actual contrast level NCR is above the upper boundary FS.

10. A method as claimed in claim 9, wherein for each rectangle Ri',j' whose number of normal contrast levels NNG is less than or equal to 2, the value of this (these) normal contrast level(s) NNG is determined from a rectangle Ri,j comprising three previously assigned normal contrast levels, by assigning step-by-step the normal contrast levels of the pixels common to the rectangle(s) which overlap between the rectangles Ri,j and Ri',j'.

11. A method as claimed in claim 7, wherein when no rectangle Ri,j has a number of normal contrast levels NNG equal to three, but at least one rectangle Ri,j has a number of normal contrast levels equal to two, namely, a lower normal contrast level and an upper normal contrast level, the normal contrast level gray is assigned to one of the normal contrast levels of at least one rectangle, called the first rectangle, having two normal contrast levels, and the normal contrast levels of the other rectangles are assigned step-by-step from the first rectangle.

12. A method as claimed in claim 11, wherein the normal contrast level gray of the first rectangle is assigned by visual examination and manual capture.

13. A method as claimed in claim 7, wherein, when no rectangle Ri,j has a number of normal contrast levels NNG equal to three, the rectangles Ri,j are processed one after the other, step-by-step, in successive stages, by comparing in each stage a zone, called the source zone, formed of at least one rectangle Ri,j having previously undergone such a stage, and a rectangle Ri,j having an overlap zone in common with the source zone.

14. A method as claimed in claim 7, wherein, when the number of normal contrast levels of all the rectangles Ri,j is equal to 1, the normal contrast level gray is assigned to all the pixels of the image.

15. A method as claimed in claim 2, wherein, when the normal contrast levels have been assigned to all the pixels of a rectangle Ri,j, this rectangle Ri,j is subjected to a reduction processing, comprising a median filtering in the course of which each pixel is assigned the median value of the normal contrast levels of the set of pixels comprising this pixel and the pixels surrounding it.

16. A method as claimed in claim 2, wherein the source image (3a, 3b) is reconstructed by reassembling the rectangles Ri,j, one after the other, in successive reassembly stages, from a gray image of the same format as the source image (3a, 3b), and by executing, pixel by pixel, an extended OR logical rule OR+ between the image of the preceding stage and the rectangle Ri,j to be reassembled, by assigning to each pixel of the source image (3a, 3b) to be reconstructed the normal contrast level:
   white if the pixels of the image of the preceding reassembly stage and of the rectangle Ri,j are, respectively, white and gray, or white and white;
   black if the pixels of the image of the preceding reassembly stage and of the rectangle Ri,j are, respectively, black and gray, or black and black;
   gray in the other cases.

17. A method as claimed in claim 1, wherein a logical rule of comparison is used which is selected from the following logical rules of comparison:

extended AND function AND+: each pixel of the result image is assigned the normal contrast level:
- black if the two corresponding pixels of the source images are black,
- white if the two corresponding pixels of the source images are white,
- gray in the other cases, extended exclusive-OR function XOR+: each pixel of the result image is assigned the normal contrast level:
- gray if the two corresponding pixels of the source images have the same normal contrast level,
- white if the two corresponding pixels of the source images are white and gray, or white and black, or gray and black,
- black if the two corresponding pixels of the source images are black and gray, or black and white, or gray and white.

18. A method as claimed in claim 1, wherein at least one of the source images results from a differentiation stage performed previously between two images, called initial images, representing a surface portion of an integrated circuit chip, and in the course of which the actual contrast level NCR of each pixel of the source image is calculated from the actual contrast levels NCRA and NCRB of the corresponding pixels of the same location of the initial images, according to the formula: NCR=(NCRA−NCRB)/2+INT(E/2).

19. A method as claimed in claim 18, wherein integration and median filtering are performed on the initial images which are then differentiated to obtain a source image.

20. A method as claimed in claim 1, wherein, prior to using a source image in an image comparison stage, an integration of this source image is performed on several identical photographs corresponding to this source image, and a median filtering is performed by assigning to each pixel the median value of the set of pixels formed by this pixel and the pixels surrounding it, so as to suppress the peaks due to noise.

21. A method as claimed in claim 1, wherein the result image (14) is subjected to a reduction processing comprising a median filtering consisting in assigning to each pixel the median value of the normal contrast levels of the set of pixels comprising this pixel and the pixels surrounding it, followed by an erosion and expansion processing for the normal contrast levels white and black.

* * * * *